United States Patent
Forstner

(10) Patent No.: US 7,492,180 B2
(45) Date of Patent: Feb. 17, 2009

(54) APPARATUS AND METHODS FOR PERFORMING A TEST

(75) Inventor: Johann Peter Forstner, Steinhöring (DE)

(73) Assignee: Infineon Technologies AG, Munich (DE)

( * ) Notice: Subject to any disclaimer, the term of this patent is extended or adjusted under 35 U.S.C. 154(b) by 202 days.

(21) Appl. No.: 11/427,847

(22) Filed: Jun. 30, 2006

(65) Prior Publication Data

US 2007/0285183 A1  Dec. 13, 2007

(30) Foreign Application Priority Data

May 24, 2006  (DE) .................. 10 2006 024 460

(51) Int. Cl.
   G01R 31/26  (2006.01)
   G01R 31/02  (2006.01)
   G01R 31/28  (2006.01)
(52) U.S. Cl. ............... 324/765; 324/763; 324/158.1
(58) Field of Classification Search ............ 324/763, 324/765, 158.1
   See application file for complete search history.

(56) References Cited

U.S. PATENT DOCUMENTS

| | | | | |
|---|---|---|---|---|
| 3,599,197 | A | * | 8/1971 | Boyko ............... 340/561 |
| 4,630,003 | A | * | 12/1986 | Torizuka et al. ........ 331/99 |
| 5,157,356 | A | * | 10/1992 | Wedge ............... 331/60 |
| 5,376,902 | A | | 12/1994 | Bockelman et al. ........ 333/5 |
| 5,578,970 | A | * | 11/1996 | Nguyen et al. .......... 331/75 |
| 6,204,739 | B1 | * | 3/2001 | Sakamoto et al. ...... 333/219.1 |
| 6,756,857 | B2 | * | 6/2004 | Aikawa et al. ........ 331/177 V |
| 2005/0212090 | A1 | | 9/2005 | Friedrich et al. ........ 257/620 |
| 2006/0049979 | A1 | | 3/2006 | Miosga et al. ......... 342/175 |
| 2006/0119530 | A1 | | 6/2006 | Kronberger ........... 343/803 |

FOREIGN PATENT DOCUMENTS

| | | |
|---|---|---|
| DE | 69423684 T2 | 11/2000 |
| DE | 10026227 A1 | 12/2001 |
| DE | 102004014644 A1 | 10/2005 |
| DE | 102004027839 A1 | 1/2006 |
| EP | 1024590 A1 | 8/2000 |
| EP | 1231825 A1 | 8/2002 |
| WO | 98/16848 A1 | 4/1998 |
| WO | 03/100456 A1 | 12/2003 |

OTHER PUBLICATIONS

U.S. Appl. No. 11/427,852, filed Jun. 30, 2006 entitled "Integrated Circuit for Transmitting and/or Receiving Signals".
U.S. Appl. No. 11/427,858, filed Jun. 30, 2006 entitled "Integrated Multi-Mixer Circuit".
Dearn "An RFOW Testable DRO for use within a Complete MMIC Low Noise Downconverter" (4 pages).
Haydl et al. "Single-Chip Coplanar 94-GHz FMCW Radar Sensors" IEEE Microwave and Guided Wave Letters, vol. 9, No. 2 (pp. 73-75), Feb. 1999.

* cited by examiner

Primary Examiner—Ha Tran T Nguyen
Assistant Examiner—Karen M Kusumakar
(74) Attorney, Agent, or Firm—Eschweiler & Associates, LLC

(57) ABSTRACT

A circuit structure has a circuit portion with negative resistance and a test resonator structure. Furthermore, the circuit structure has a unit for coupling the test resonator structure to the circuit portion with negative resistance during testing and for decoupling the test resonator structure from the circuit portion with negative resistance after testing.

12 Claims, 4 Drawing Sheets

APPARATUS AND METHODS FOR PERFORMING A TEST

PRIORITY

This application claims priority from German Patent Application No. 10 2006 024 460.5, which was filed on May 24, 2006, and is incorporated herein by reference in its entirety.

TECHNICAL FIELD

The present invention relates to apparatus and a method for performing a test, and particularly apparatus and methods suitable for testing circuit structures for vehicle radar systems.

BACKGROUND

In newer generation vehicle radar systems, a high degree of integration is sought, which means that circuits previously realized discretely are increasingly replaced by IC solutions. In the area of microwave technology, the trend is towards MMIC solutions (MMIC=monolithic microwave integrated circuits). One problem here is the testability of the individual MMICs. Performing the tests has to ensure, on the one hand, that the produced circuits correspond to the specifications in their individual parameters, on the other hand, such tests represent a cost-intensive factor in the production of such integrated circuits.

It is precisely the performance of tests for high frequency integrated devices, such as at frequencies in the range of 80 GHz in the vehicle radar technology, that involves much effort and cost. In vehicle radar systems, there are often used DROs (oscillators with dielectric resonator). These devices have a high resonator quality and thus result in very high spectral purity. Testing such DROs proves to be problematic, since the corresponding tests generally cannot be performed as on-wafer test (OW test), because, in a DRO, the frequency-determining element is typically a dielectric pill that is coupled off-chip to the oscillator core. For this reason, performing an OW test of the corresponding chip is only possible with restrictions during the production.

SUMMARY

According to an embodiment, a circuit structure comprises a circuit portion with negative resistance, a test resonator structure and means for coupling the test resonator structure to the circuit portion with negative resistance to form a test oscillator during testing, and for decoupling the test resonator from the circuit portion with negative resistance after testing.

BRIEF DESCRIPTION OF THE DRAWINGS

Preferred embodiments of the present invention are explained in more detail below with respect to the accompanying drawings, in which.

DETAILED DESCRIPTION

According to one embodiment, a test method for performing a circuit test has the steps of coupling a test resonator structure to a circuit portion with negative resistance for forming a test oscillator, performing a test using the test oscillator, and decoupling the test resonator structure from the circuit portion with negative resistance.

Thus, these embodiments have the advantage that they allow on-wafer testing of a circuit operated, in its later application, with an external resonator, for example a dielectric resonator, that may comprise a dielectric pill.

According to one embodiment, an apparatus for testing a mixer, comprises: an oscillator for generating a signal oscillating at an oscillator frequency; a phase shifter circuit coupled to the oscillator for generating a phase-shifted signal at the oscillator frequency, wherein a first input of the mixer is coupled to the oscillator to receive the signal oscillating at the oscillator frequency, and a second input of the mixer is coupled to the phase shifter circuit to receive the phase-shifted signal oscillating at the oscillator frequency; and a power detector for detecting a power of the phase-shifted signal oscillating at the oscillator frequency.

According to a further embodiment, the invention provides a test method for performing a test on a mixer, comprising: applying an oscillator signal to a first input of a mixer, applying a phase-shifted version of the oscillator signal to a second input of the mixer, detecting the power of the phase-shifted version of the oscillator signal, and determining the conversion gain of the mixer based on an output signal of the mixer and the detected power of the phase-shifted oscillator signal.

Thus, these embodiments allow to do without cost-intensive high frequency meters, because the measurement can be performed completely in the low frequency range, although there is an operation in the high frequency range for testing.

Figure 1:
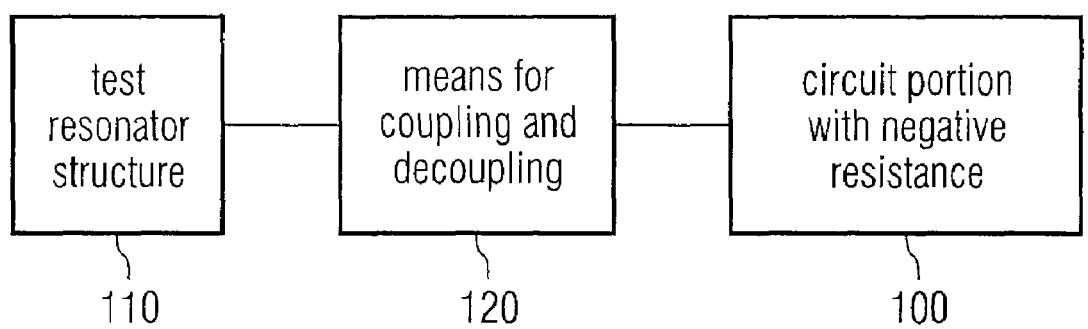
FIG. 1 is a schematic block diagram of a circuit structure of an embodiment.
Figure 2:
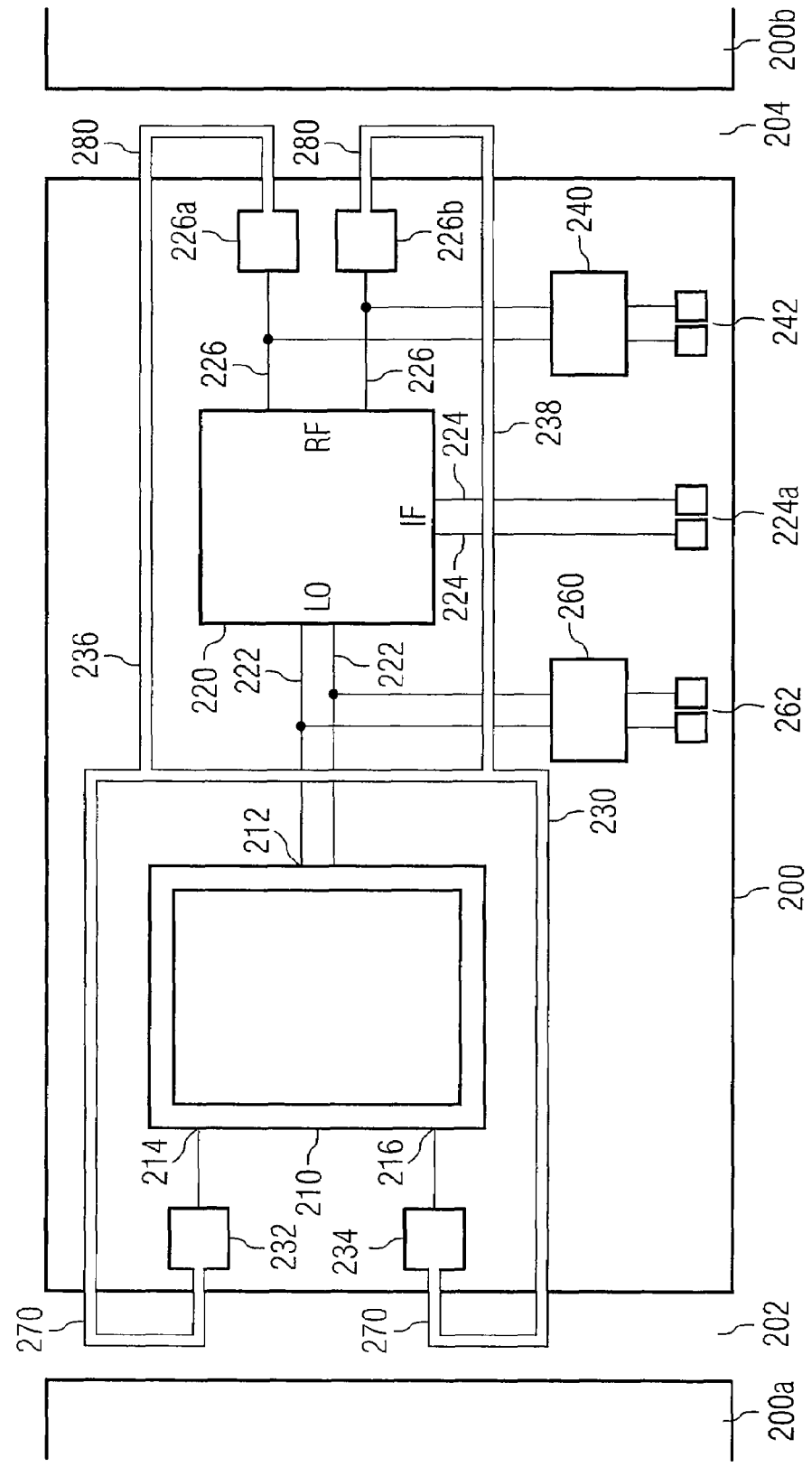
FIG. 2 is a schematic block circuit diagram of an on-chip realization of an embodiment.
Figure 3:
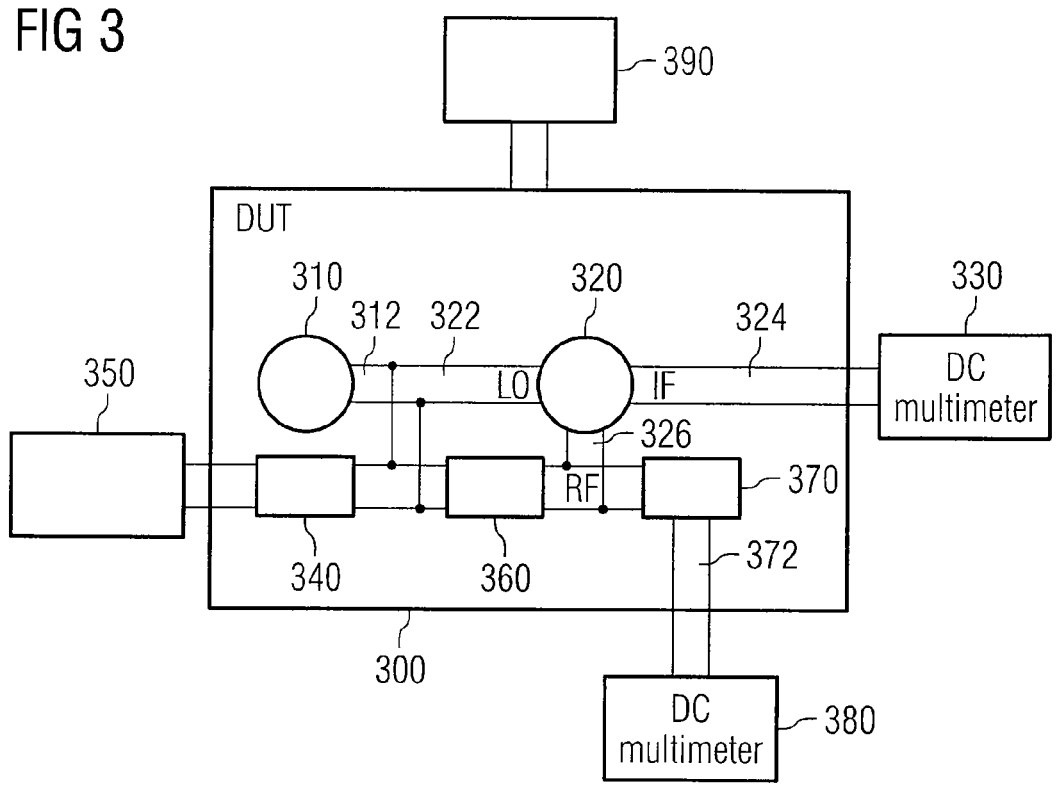
FIG. 3 is a schematic block circuit diagram for the explanation of an embodiment of a measurement apparatus and a measurement method.
Figure 4:
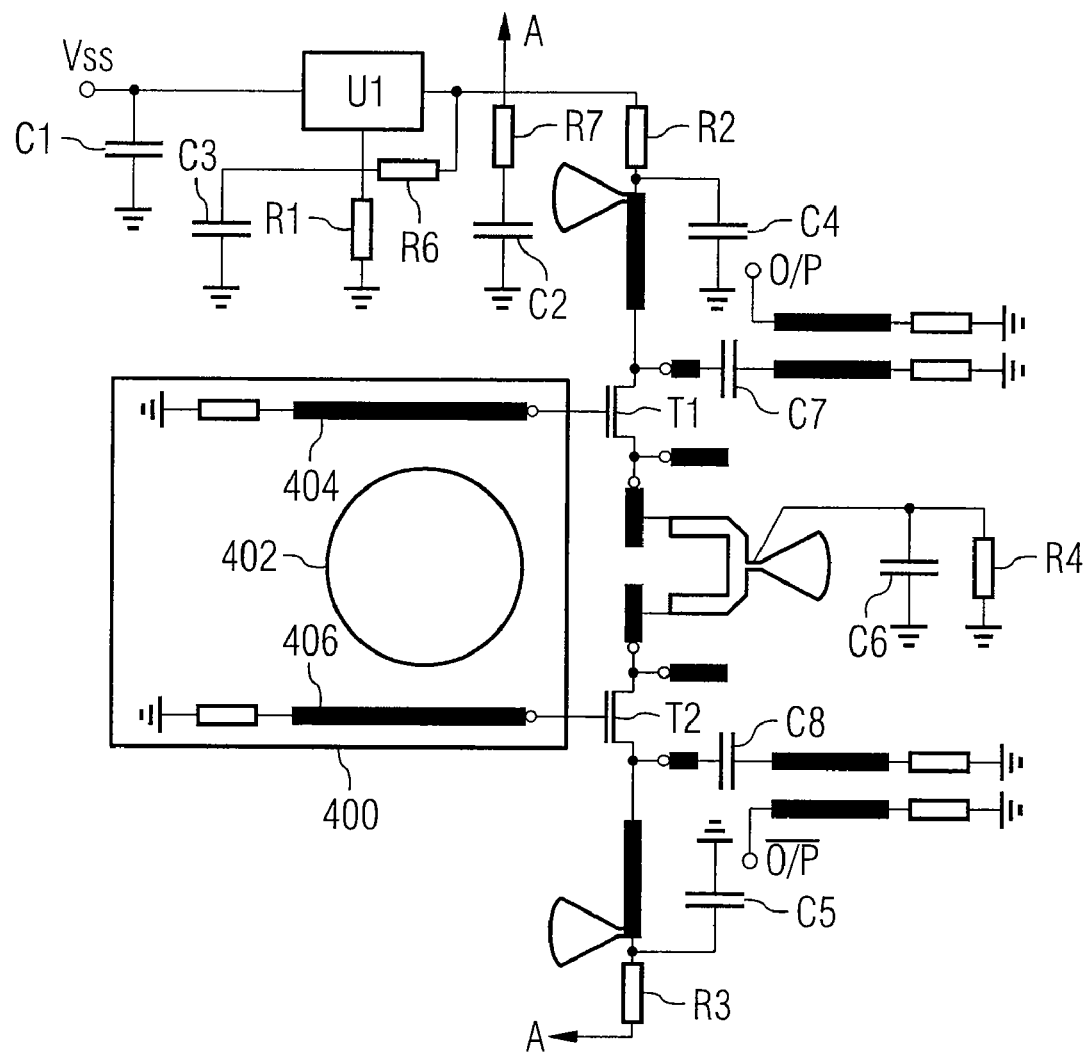
FIG. 4 is an illustration of a discrete structure of a DRO.

Before the invention is explained in detail based on FIGS. 1 to 3, the structure of a DRO is made clear with the help of FIG. 4.

A discretely realized DRO is illustrated in FIG. 4. The oscillator includes a dielectric resonator 400 including coupling and a circuit core with negative resistance formed by the remaining circuit elements in FIG. 4. The structure of such a circuit core with negative resistance is known to those skilled in the art and does not need to be further explained here.

The dielectric resonator 400 includes a dielectric pill 402 and leads 404 and 406, via which the dielectric resonator is connected to base terminals of transistors T1 and T2 of the circuit core with negative resistance.

The dielectric resonator 400 generally represents an external device that is connected to the circuit core with negative resistance to form the oscillator with the same. The functionality of the oscillator and circuits connected to the oscillator may thus not be tested before the dielectric circuit core is connected to the dielectric resonator 400. Testing an integrated realization of a DRO is thus problematic, because coupling an external dielectric resonator is nearly impossible during production and prior to chip singulation. The individual transistors, as illustrated as T1 and T2 in FIG. 4, are tested by semiconductor suppliers for their functionality and conformance with the specifications.

FIG. 1 shows a block circuit diagram of a circuit structure according to an embodiment, in which means for coupling and decoupling 120 is arranged between a test resonator structure 110 and a circuit portion with negative resistance 100. The means 120 for coupling and decoupling is designed to connect the test resonator structure 110 to the circuit portion 100 with negative resistance during testing to form a test oscillator. The means for coupling and decoupling is further designed to decouple the test resonator structure from the circuit portion with negative resistance after the testing, preferably in a permanent way.

The means 120 for coupling and decoupling may be implemented by a switching means, for example a transistor, but it is preferably designed to permanently decouple the test resonator structure from the circuit portion with negative resistance. In this respect, the means 120 may, for example, be formed by a fuse structure that may be broken optically (for example by means of a laser) or electrically (by a current). Alternatively, the means 120 may be formed by conductor portions on such portions of a wafer that are removed from the wafer when singulating chips, wherein, after the singulating, the test resonator structure 110 and the circuit portion with negative resistance 100 remain decoupled from each other on a chip.

In embodiments, the circuit portion with negative resistance may be connected to one or more further circuit portions to be tested (not shown) that operate on the basis of an oscillator signal provided by the test oscillator formed.

The circuit portion 100 with negative resistance may be formed by any such circuit portion that forms a test oscillator with a corresponding test resonator structure 110. For example, the circuit portion may be designed corresponding to the circuit portion shown in FIG. 4, which is connected to a dielectric resonator, for example a DRO as shown in FIG. 4, after the testing, i.e. the decoupling from the test resonator structure 110.

FIG. 2 shows an embodiment in more detail, in which an circuit structure is formed on a wafer comprising a chip 200. The wafer comprises a plurality of circuit chips, wherein FIG. 2 schematically indicates two more chips 200a and 200b separated from the chip 200 by areas 202 and 204, which are removed when singulating the chips 200, 200a, 200b. In other words, the areas 202 and 204 may be referred to as sawing streets.

The circuit structure includes a circuit portion 210 with negative resistance followed downstream by a mixer 220. In the embodiment shown in FIG. 2, the signals are differential, respectively, so that two terminals and respective line pairs are shown, respectively, on which signals phase-shifted by 180° are transmitted. The output of the circuit portion 210 with negative resistance is connected to an LO input 220 of the mixer (LO=local oscillator). Furthermore, the mixer comprises an intermediate frequency output 224, also referred to as IF output (IF=intermediate frequency), and a high frequency input 226, also referred to as RF input (RF=radio frequency). The intermediate frequency output 224 is led to pads 224a, while radio frequency signals are received at the RF input via pads 226a and 226b.

On the chip, there is further a test resonator structure in the form of a line resonator 230 to which the circuit portion 210 with negative resistance is connected, so that the line resonator 230 together with the circuit portion with negative resistance 210 forms a test oscillator. An output 212 of the test oscillator is connected to the LO input 222 of the mixer 220. The circuit portion 210 with negative resistance may have any structure, for example one as shown in FIG. 4, wherein then the base terminals of the transistors T1 and T2 may be connected to the ends of the line resonator implemented as a loop. In the shown embodiment, the ends of the line resonator 230 are connected to pads 232 and 234 connected to the corresponding inputs 214 and 216 of the circuit portion 210.

Conductors 236 and 238 are coupled to the line resonator 230 and form an outcoupling structure to supply part of the signal of the line resonator 230 to the radio frequency input 226 of the mixer 220. Specifically, ends of the coupling conductors 236 are connected to the pads 226a and 226b.

Furthermore, a power detector 240 is provided to detect the power applied to the RF input 226 and to output it at its output onto pads 242. The lines 236 and 238, which couple out a signal portion from the line resonator 230 and supply it to the radio frequency input 226 of the mixer, represent phase lines and provide a defined phase shift of the signal applied to the RF input relative to the test oscillator signal applied to the LO input 222 of the mixer. The lines 236 and 238 thus represent delay lines. The test oscillator signal applied to the LO input 222 of the mixer 220 is further supplied to a frequency divider 260 dividing the frequency of the supplied signal in a defined ratio and providing a measure for the divided frequency on pads 262. The signal applied to the pads 262 and indicating the frequency may be detected using a frequency counter, which represents a low cost alternative to using radio frequency meters, because frequency dividers divide the frequency of a signal accurately in a predefined ratio, so that a correspondingly lower frequency may be measured and projected.

The pads 224a, 226a, 226b, 232, 234, 242 and 262 represent pads that are led to the outside and may be accessed from the outside after the completion of the chip, i.e. after singulation and optionally packaging of the same. The pads 232 and 234 represent pads at which the circuit structure, after testing the same, is connected to a dielectric resonator, while a radio frequency signal is input to the mixer at the RF pads 226a, 226b, and an intermediate frequency signal is output from the mixer at the IF pads 224a.

As shown in FIG. 2, line portions 270 of the line resonator 230 are led beyond geometric chip boundaries of the chip 200, adjacent to the pads 232 and 234. Furthermore, line portions 280 of the outcoupling conductors 236 and 238 are led beyond the geometric chip boundaries of the chip 200. The conductor portions 270 and 280 are located on the wafer areas 202 and 204 that are disconnected when singulating the chips, i.e. that represent sawing streets. These conductor portions 270 and 280 are thus disconnected when singulating the chips, which may be done, for example, by sawing, lasing, etching or the like, so that the line resonator 230 is disconnected from the pads 232 and 234, and the outcoupling conductors 236 and 238 are disconnected from the pads 226a and 226b.

FIG. 2 thus shows a chip for a DRO that will later be connected to a dielectric resonator (not shown) to provide a local oscillator signal to the mixer 220. The dielectric resonator is an external device with which the chip 200 is loaded after singulating, so that the chip with the mixer 220 conventionally could not be tested on a wafer basis, because the necessary LO signal was lacking.

In embodiments, a test resonator is formed by the line resonator 230 and the circuit portion 210 with negative resistance to allow such on-wafer testing. In order to perform testing, the circuit portion 210 with negative resistance is provided with corresponding supply voltages so that the test oscillator formed by the circuit portion 210 and the line resonator 230 is oscillated and provides an LO signal at its output 212. The LO signal is supplied to the mixer 220 at the LO input 222. A radio frequency signal is additionally necessary to test the mixer 220. In embodiments, this radio frequency signal is provided by the outcoupling lines 236 and 238. Such a procedure is particularly advantageous in the area of vehicle radar systems, in which there is often used an FMCW (frequency modulated continuous wave) method, in which the frequency of a reception signal received at the pads 226a and 226b is nearly identical to that of the output signal, wherein the frequency of the output signal corresponds to that of the LO signal. Correspondingly, in the shown embodiment, part of the signal present on the line resonator 230 is supplied to the RF input 226, so that a DC offset may be measured at the output 224 of the mixer and thus at the pads 224 of the mixer 220. If the amplitude, frequency and phase position of the signal at the RF input are known, the mixer may be characterized with respect to its conversion gain at the frequency zero.

The phase position is known due to the defined phase delay provided by the outcoupling lines 236 and 238. The measurement of the frequency may be done via the provided on-chip frequency divider 260, while the power of the signal may be determined by the on-chip power detector 240. On the basis of the DC signals applied to the pads 224a and 242 and the signal applied to the pads 262 and indicating the frequency of the LO signal, there may now be determined the conversion gain of the mixer 220 for a known phase relationship between the LO signal and the signal applied to the RF input 226.

A considerable advantage of the described test method is that no radio frequency measurements are necessary, because only low frequency signals are generated at the frequency divider output 262 and DC signals are applied to the pads 224a and 242. This allows a very low cost test still guaranteeing high test coverage.

After performing the testing, the conductor portions 270 and 280 are disconnected, for example by singulating the chip 200, so that the line resonator 230 and the outcoupling lines 236 and 238 are decoupled from the circuit core with negative resistance 210 and the RF input of the mixer 220. Subsequently, the circuit portion with negative resistance 210 may be connected to a conventional dielectric resonator to form a DRO. The frequency divider 260 and the power detector 240 may be disconnected and/or decoupled after a successful test. Alternatively, they may also remain on the chip for monitoring purposes.

All test circuits and/or structures required for the test may be disconnected and/or deactivated after a successful test, so that there are no restrictions for the final application of the chip. In alternative embodiments, at least those structures may be disconnected and/or decoupled that would affect the final application of the chip. In the final application, for example, the circuit portion with negative resistance is connected to a dielectric resonator to form a DRO.

The described test method may be used in embodiments for testing mixer circuits, independent of the oscillator circuit providing the local oscillator signal. Such a test method is particularly advantageous in that there may be performed an extensive circuit test without the aid of radio frequency meters, which are very cost-intensive.

An embodiment of a measurement realization is schematically illustrated in FIG. 3. FIG. 3 shows a chip 300 on which there is an oscillator 310. An output 312 of the oscillator is connected to an LO input 322 of a mixer 320. An intermediate frequency output 324 of the mixer is led to the outside, so that the signal applied therein may be measured from the outside with a DC multimeter 330. The output 312 of the oscillator is further connected to a frequency divider 340 whose outputs are led to the outside and are connected to a frequency counter 350. The frequency counter 350 allows to determine the oscillator frequency via the frequency divider 340 dividing the frequency of the output signal of the oscillator in a defined ratio.

A delay line 360 is further coupled to the output 312 of the oscillator 310, the delay line causing a defined phase shift of the output signal of the oscillator 310, wherein the phase-shifted output signal of the delay line 360 is applied to the RF input 326 of the mixer 320. Furthermore, it is supplied to a power detector 370 providing a voltage measure at its led out output 372 which is proportional to the power supplied to the RF input 326 of the mixer 320. This voltage signal may, in turn, be measured with a DC multimeter 380. The energy supply of the chip 300 representing the device under test (DUT) is provided by an external power source 390 during the test.

As can be seen from the shown measurement setup, only DC measurements and/or low frequency measurements are necessary to test the chip 300, which is a basic requirement for a low cost test method. Still, the test method is advantageous in that a very high test coverage is achieved, because the circuit to be tested is operated with radio frequency signals in spite of the use of low frequency measurement instruments.

Summarizing, it can be said that embodiments allow to test circuit structures requiring an oscillator signal without the need of an external resonator element. For this purpose, test resonator structures are provided in embodiments that are disconnected and/or decoupled after testing, so that the final application does not suffer any noticeable restriction and/or interference.

In further summary, embodiments provide apparatus and methods allowing to test circuit structures operated with radio frequency signals by applying a local oscillator signal to the local oscillator input of a mixer 320 and applying a phase-shifted version of the local oscillator signal to the RF input of the mixer.

Embodiments are particularly well-suited to test circuit structures operating in the GHz range, for example those designed for frequencies of more than 1 GHz, preferably more than 20 GHz and more preferably more than 70 GHz.

In embodiments, the circuits and circuit structures may be formed on a semiconductor substrate, for example a silicon substrate or a GaAs substrate. The radio frequency-capable components and devices of these circuits may be produced by radio frequency-capable processes, for example an Si/SiGe process or an indium phosphide process.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit structure comprising:
   a circuit portion with negative resistance;
   a test resonator structure; and
   a unit for coupling the test resonator structure to the circuit portion with negative resistance to form a test oscillator during testing, and for decoupling the test resonator structure from the circuit portion with negative resistance after testing, further comprising a circuit portion to be tested comprising an input coupled to an output of the circuit portion with negative resistance.

2. The circuit structure of claim 1, wherein the test resonator structure comprises a line resonator.

3. The circuit structure of claim 1, wherein the circuit portion with negative resistance and the test resonator structure are formed on a substrate.

4. The circuit structure of claim 1, further comprising a signal outcoupling unit for coupling out a signal portion from the test resonator structure and for coupling to a second input of the circuit portion to be tested.

5. The circuit structure of claim 4, comprising a unit for coupling the signal outcoupling unit to the second input of the circuit portion to be tested during testing and for decoupling after testing.

6. The circuit structure of claim 4, wherein the signal outcoupling unit comprises a phase delay line.

7. The circuit structure of claim 4, comprising a power detector for detecting the power of a signal coupled out by the signal outcoupling unit.

8. The circuit structure of claim 7, wherein the circuit portion to be tested is a mixer, and wherein the circuit structure comprises at least a first output terminal for outputting an output signal of the mixer and at least a second output terminal for outputting an output signal of the power detector.

9. The circuit structure of claim 4, further comprising a frequency divider for dividing the frequency of a signal coupled out by the signal outcoupling unit.

10. A circuit structure comprising:
    a circuit portion with negative resistance;
    a test resonator structure; and
    a unit for coupling the test resonator structure to the circuit portion with negative resistance to form a test oscillator during testing, and for decoupling the test resonator structure from the circuit portion with negative resistance after testing, wherein the unit for coupling and decoupling comprise a conductor portion in an area to be disconnected from a substrate or a fuse structure, wherein the area to be disconnected is an area that is disconnected from the substrate during singulating from a wafer arrangement.

11. The circuit structure of claim 1, further comprising a dielectric resonator forming an oscillator with the circuit portion with negative resistance, and wherein the test resonator structure is permanently decoupled from the circuit portion with negative resistance.

12. A circuit structure comprising:
    a circuit substrate;
    a circuit portion with negative resistance on the circuit substrate;
    a test line resonator on the circuit substrate;
    a signal outcoupling line coupled to the test line resonator on the circuit substrate;
    a mixer on the circuit substrate, wherein a first input of the mixer is coupled to an output of the circuit portion with negative resistance and a second input of the mixer is coupled to an output of the signal outcoupling line; and
    a disconnectable conductor structure or a fuse structure coupling the test line resonator to the circuit portion with negative resistance during testing for forming a test oscillator, and decoupling the test line resonator from the circuit portion with negative resistance after testing.

* * * * *